United States Patent [19]

Alpatoff et al.

[11] 3,918,044

[45] Nov. 4, 1975

[54] COMPENSATED COORDINATE RESOLUTION CIRCUIT

[75] Inventors: Dimitri Alpatoff, Victoria; Jacques Paul-Emile Lamontagne, Chateauguay, both of Canada

[73] Assignee: Aviation Electric, Limited, Montreal, Canada

[22] Filed: Sept. 7, 1973

[21] Appl. No.: 395,109

[52] U.S. Cl. .................... 340/347 SY; 340/347 AD

[51] Int. Cl.² .......................................... G08C 9/04

[58] Field of Search ....... 340/347 SY, 347 AD, 198; 318/656, 661

[56] References Cited

UNITED STATES PATENTS

| | | | |
|---|---|---|---|
| 3,136,987 | 6/1964 | Bock et al. | 340/347 SY |
| 3,255,448 | 6/1966 | Sadvary et al. | 340/347 SY |
| 3,490,016 | 1/1970 | Taylor | 340/347 SY |
| 3,504,361 | 3/1970 | Catton | 340/347 SY |

*Primary Examiner*—Charles D. Miller

*Attorney, Agent, or Firm*—S. H. Hartz; Anthony F. Cuoco

[57] ABSTRACT

A converter for converting angular or heading datum from a shaft position to electrical signals corresponding to sine-cosine components and in which the electrical signals are immune to the influence of unwanted deteriorating factors, such as temperature effects and energizing voltage fluctuations. The sine-cosine components are provided in terms of voltage ratios rather than absolute voltages.

10 Claims, 6 Drawing Figures

COMPENSATED COORDINATE RESOLUTION CIRCUIT

Figure 1:
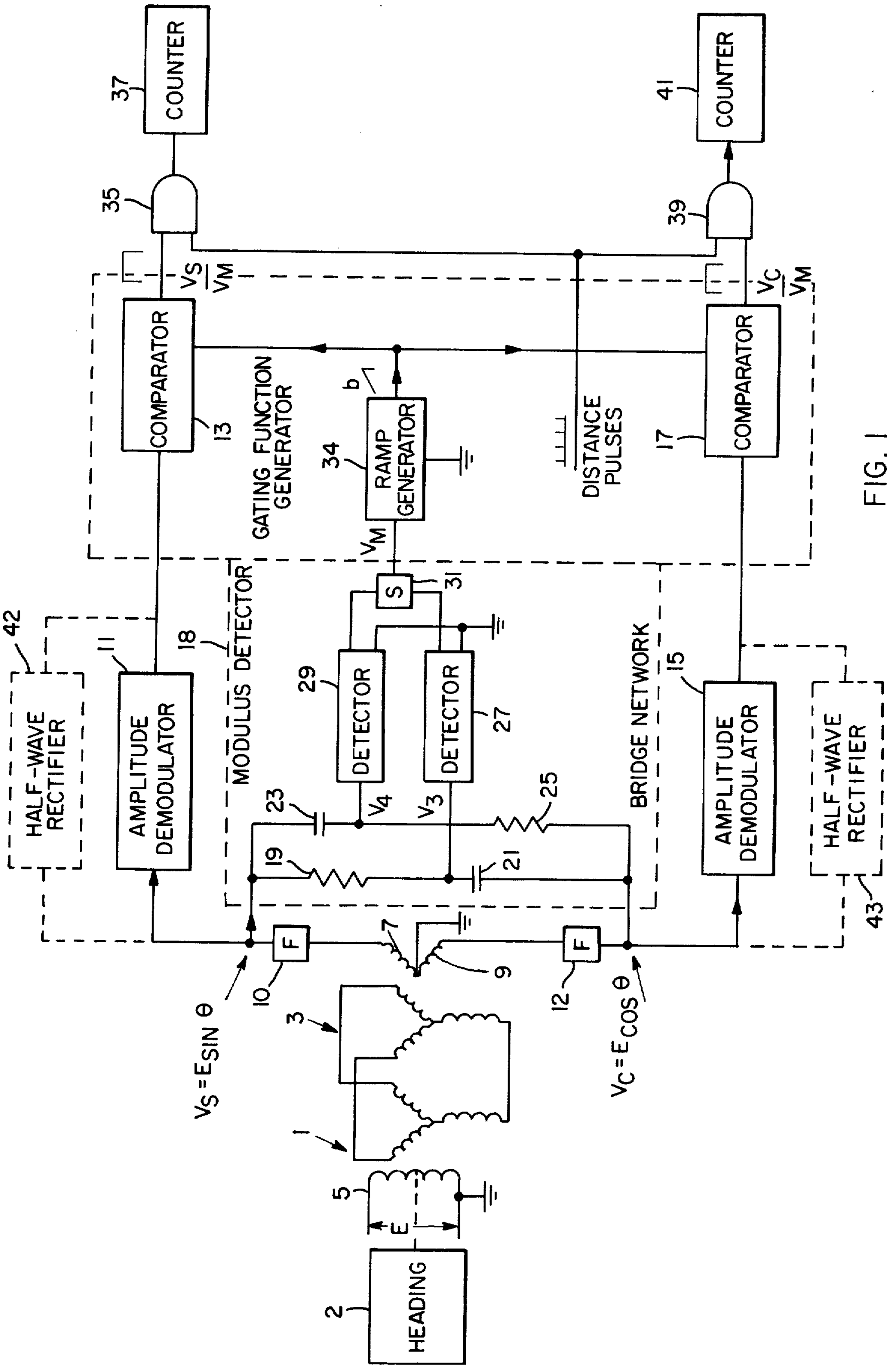

The invention relates to converters and more particularly to converters for converting angular movements to electrical signals.

Synchros are frequently used in navigation systems to convert a shaft position corresponding to angular or heading datum to electrical signals corresponding to the sine and cosine of the heading angle. In devices as used heretofore, the signal amplitudes varied for a given heading because of fluctuations in the amplitude or frequency of the supply voltage, or temperature changes or other causes.

The present invention overcomes this difficulty by providing sine-cosine components in terms of voltage ratios rather than absolute voltages by comparing the sine-cosine electrical signals with a reference voltage which is derived from the electrical signals and fluctuates only in accordance with signal irregularities. The fluctuations in the electrical signals and reference voltages cancel and the sine-cosine components are constant and repeatable for any given heading.

The invention contemplates a device for converting angular movement to electrical signals comprising a signal device connected to a source of voltage subject to irregularities and energized thereby and having an angularly displaceable element and providing two signals varying in amplitude as a function of the sine and cosine of the angular displacement, the signals being subject to the irregularities in the energizing source and to changes in ambient conditions and fluctuating as a result thereof, means for deriving a reference voltage from the two signals so that the amplitude of the reference voltage fluctuates in accordance with fluctuations of the signals due only to the irregularities in the energizing source, and means responsive to the amplitudes of the signals and reference voltage and providing outputs corresponding to the ratios of the signals and the reference voltage in which fluctuations due to irregularities of the energizing voltage and changes in ambient conditions are cancelled.

One object of the present invention is to provide sine-cosine components in terms of voltage ratios so that unwanted fluctuations cancel.

Another object is to compare the sine-cosine signals with a reference voltage which fluctuates in accordance with signal irregularities.

Another object is to derive the reference voltage from the heading signals to compensate for signal irregularities.

These and other objects and advantages of the invention will appear more fully hereinafter from a consideration of the detailed description which follows, taken together with the accompanying drawings wherein one embodiment of the invention is illustrated by way of example. It is to be understood, however, that the drawings are for the purpose of illustration only and are not a definition of the limits of the invention, reference being had to the appended claims.

Figure 2:
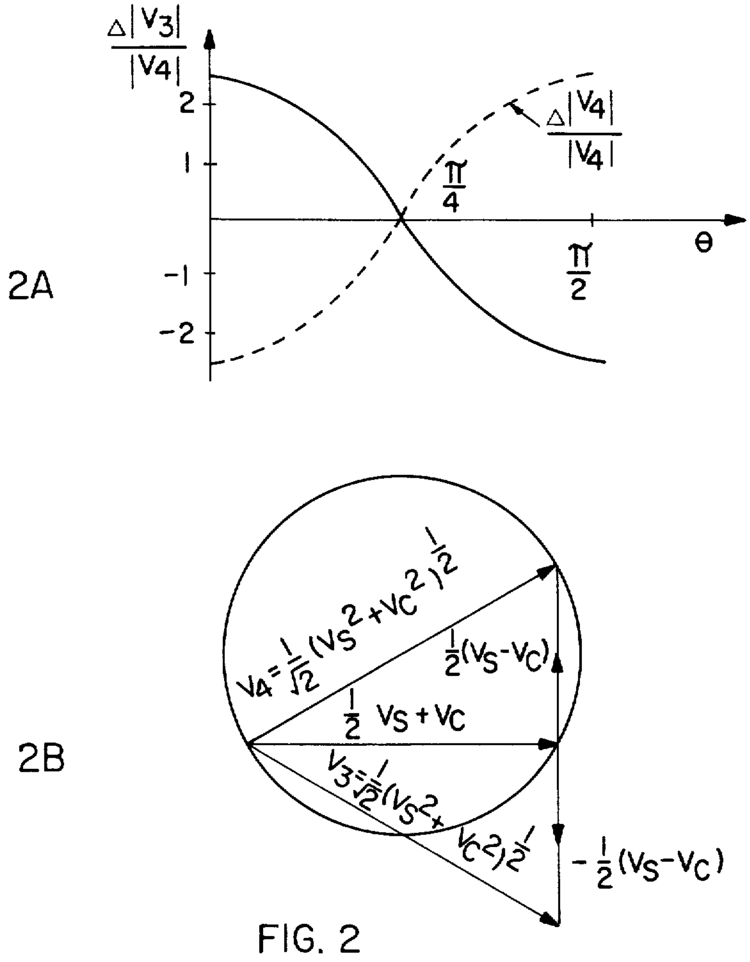
Figure 3:
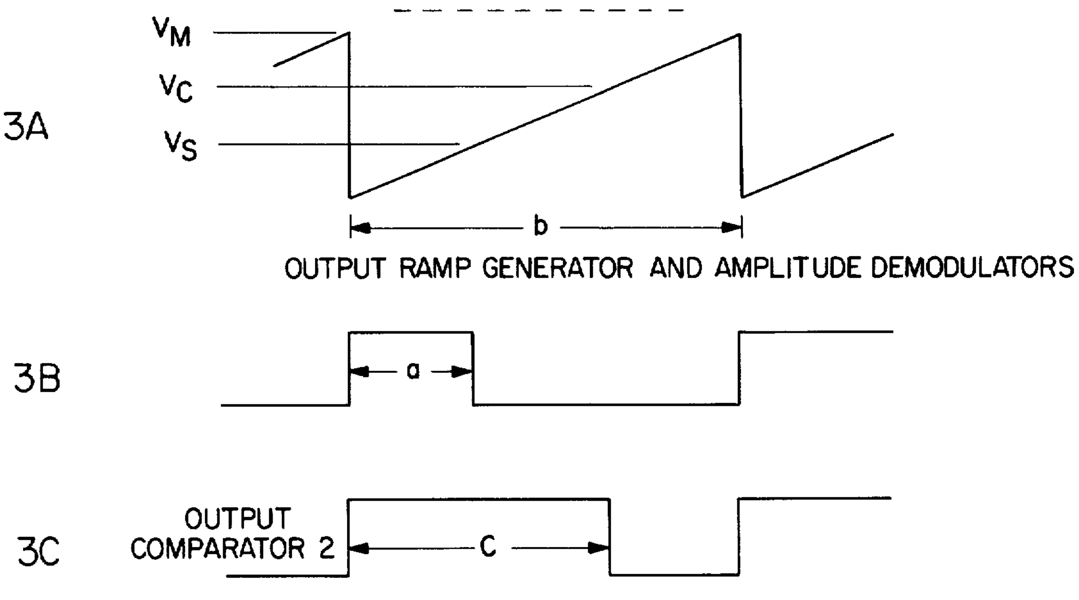

In the drawings,

FIG. 1 is a schematic circuit diagram showing a converter constructed according to the invention, FIGS. 2A and 2B show the waveforms of the outputs of the phase shifting circuit in FIG. 1 and the mathematical derivation of the voltages, and FIGS. 3A–3C show the waveforms of the voltages compared by the comparators in FIG. 1 and their outputs.

Referring to the drawings, a novel converter is shown in FIG. 1 and comprises a signal device 1, such as a synchro, operated by a heading sensor 2, such as a compass or directional gyroscope. Synchro 1 is connected back to back to a resolver 3. Synchro 1 has a rotor winding 5 energized by a voltage E from an alternating current source and resolver 3 has a pair of mutually perpendicular windings 7 and 9 so that when rotor winding 5 is rotated through an angle $\theta$ signals $V_s = E \sin\theta$ and $V_c = E \cos\theta$ are induced in windings 7 and 9, respectively. Signal $V_s$ is filtered by a filter 10 and applied to an amplitude demodulator 11 and the demodulated signal is applied to a comparator 13. Signal $V_c$ is filtered by a filter 12 and applied to an amplitude demodulator 15 and the demodulated signal is applied to a comparator 17.

A bridge circuit 18 has a series connected resistor 19 and capacitor 21 and a series connected capacitor 23 and resistor 25 connected in parallel. The filtered signal $V_s$ is applied to resistor 19 and capacitor 23 and the filtered signal $V_c$ is applied to capacitor 21 and resistor 25.

The bridge circuit produces output signals $V_3$ and $V_4$ between respective resistors and capacitors. The impedance of resistor 19 is equal to that of capacitor 21 at the frequency of the signal source $E$. Similarly, the impedance of the resistor 25 is equal to that of capacitor 23. With this arrangement, voltage $V_3$ is phase-shifted in one direction and voltage $V_4$ is phase-shifted an equal amount in the opposite direction and voltages $V_3$ and $V_4$ are equal in amplitude and have a value $E/\sqrt{2}$ (see mathematical derivation below).

Voltages $V_3$ and $V_4$ are applied to detectors 27 and 29, respectively. The outputs of the detectors are applied to summing point 31 to provide a mean reference voltage $V_m$. The reference voltage is converted by a ramp generator 34 to a ramp voltage $b$ shown in FIG. 3A. The ramp voltage $b$ is applied to comparators 13, 17 and compared with amplitude demodulated voltages $V_s$ and $V_c$, respectively, to provide square wave voltages a and c shown in FIGS. 3B and 3C. The square wave voltages correspond to the ratios $V_s/V_m$ and $V_c/V_m$, respectively.

Since the reference voltage $V_m$ is derived directly from the voltages $V_s$ and $V_c$, any unwanted variations in $V_s$ and $V_c$ for any given heading due to fluctuations in the amplitude or frequency of the supply voltage E or changes in temperature or other causes will also be present in the reference voltage $V_m$ and upon comparison of voltages $V_s$ and $V_c$ with reference voltage $V_m$ in comparators 13 and 17 the ratios $V_s/V_m$ and $V_c/V_m$ do not include these variations because they are cancelled.

The ratios $V_s/V_m$ and $V_c/V_m$ may readily be converted to digital numbers. The waveform representing the ratio $V_s/V_m$ is applied to one input of an AND gate 35 and clock or distance pulses are applied to a second input of the AND gate. The output of AND gate 35 is connected to a counter 37 and the number of pulses passed by AND gate 35 corresponds to the ratio of $V_s/V_m$. Likewise the waveform representing the ratio $V_c/V_m$ is applied to one input of an AND gate 39 and the clock or distance pulses are applied to a second input of AND gate 39 and the output of the AND gate is connected to a counter 41. The number of pulses passed by AND gate 35 and AND gate 39 to counters 37 and 41 correspond to the ratios $V_s/V_m$ and $V_c/V_m$, respectively.

In some applications it is permissible to simplify the circuit by replacing the amplitude demodulators 11 and 15 with half-wave rectifiers 42 and 43. The waveform from the ramp generator 34 is gated in comparators 13 and 17 at the supply frequency or the ramp frequency, whichever is higher. The gates remain open for a proportion of the lower frequency period corresponding to the sine and cosine of the angle $\theta$. Practical considerations will dictate the design choice as to which frequency must be lower depending on the minimum acceptable data rate. It is necessary not to have the two frequencies (supply and ramp) in harmonic relation unless the frequency ratio is large. The accuracy of statistical averaging depends upon non-synchronous superposition of the two waveforms or alternatively on a multiplicity of gates within the period of the lower frequency waveform.

The standard Pythagorean relationship between sine and cosine is the basis for making $V_m$ dependent upon $V_s$ and $V_c$ such that $V_s$ and $V_c$ may err over their normal range while $V_m$ adjusts as necessary to take account of such errors in $V_s$ and $V_c$. The sine-cosine relationship is as follows:

$$\sin^2\theta + \cos^2\theta = 1$$

$$\text{If } \sin\theta = \frac{V_s}{KV_m} \text{ and } \cos\theta = \frac{V_c}{KV_m} \qquad \text{(see FIG. 1)}$$

$$V_s^2 + V_c^2 = K^2V_m^2$$

In their original form as resolver outputs, $v_s$ and $v_c$ are sinusoidal a.c. signals whose envelopes are proportional to Sine $\theta$ and Cos$\theta$, respectively. If the excitation voltage $E$ has angular frequency w, then:

$$V_s \sin wt = v_s = E \sin\theta \cdot \sin wt$$
$$V_c \sin wt = v_c = E \cos\theta \cdot \sin wt$$

where $E$ is the peak value of the excitation voltage.

When $V_s$ and $V_c$ are applied to the phase shifting circuit 18 shown in FIG. 1, the following outputs $V_3$, $V_4$ may be obtained:

$$V_3 = V_s \left(\frac{-j/wC_1}{R_1 - j/wC_1}\right) + V_c \left(\frac{R_1}{R_1 - j/wC_1}\right)$$

$$V_4 = V_s \left(\frac{R_2}{R_2 - j/wC_2}\right) + V_c \left(\frac{-j/wC_2}{R_2 - j/wC_2}\right)$$

If values are chosen such that $$R_1 = \frac{1}{wC_1} \text{ and } R_2 = \frac{1}{wC_2}$$

as mentioned above then $V_3$ and $V_4$ are phase-shifted equally in opposite directions as follows:

$$V_3 = ½ (V_s + V_c) - j \cdot ½ (V_s - V_c)$$
$$V_4 = ½ (V_s + V_c) + j \cdot ½ (V_s - V_c)$$

Computing the moduli of $V_3$ and $V_4$, $$|V_3|^2 = ¼ (V_s^2 + V_c^2 + 2V_sV_c) + ¼ (V_s^2 + V_c^2 - 2V_sV_c)$$
$$|V_3| = 1/\sqrt{2}\,(V_s^2 + V_c^2)^{1/2}$$

Similarly, $$|V_4| = 1/\sqrt{2}\,(V_s^2 + V_c^2)^{1/2}$$

Now, $$V_s^2 + V_c^2 = E^2(\sin^2\theta + \cos^2\theta) = E^2$$

So, $$|V_3| = |V_4| = E/\sqrt{2}$$

which is a constant only dependent on the excitation voltage. If $V_s$ and $V_c$ are demodulated separately giving d.c. levels proportional to them, $$E^2\sin^2 wt - (V_s^2 + V_c^2)\sin^2 wt$$

But we have defined, $$K^2K_m^2 = V_s^2 + V_c^2$$

So, $$KV_m = E = \sqrt{2}\,|V_3| = \sqrt{2}\,|V_4|$$

So the constant voltages $|V_3|$ and $|V_4|$ are proportional to $V_m$ which is required as a constant.

IN CONSIDERING FREQUENCY DRIFT

Suppose $u = w/w_0$ = specific frequency So the following expressions can be derived for $|V_3|$ and $|V_4|$:

$$V_3 = E \left(\frac{1}{u^2+1}\sin^2\theta + \frac{u^2}{u^2+1}\cos^2\theta\right)^{1/2}$$

$$V_4 = E \left(\frac{u^2}{u^2+1}\sin^2\theta + \frac{1}{u^2+1}\cos^2\theta\right)^{1/2}$$

$$\left(\text{If } u = 1,\ |V_3| = |V_4| = \frac{E}{\sqrt{2}}\right)$$

Differentiating $V_3$ and $V_4$ with respect to $u$, $$\Delta|V_3| = \frac{\sqrt{2}E}{4} \cos 2\theta \cdot \Delta u$$

$$\Delta|V_4| = \frac{-\sqrt{2}E}{4} \cos 2\theta \cdot \Delta u$$

These two equations indicate that errors in $|V_3|$ and $|V_4|$ caused by small variations of $u$ about $u = 1$ are equal in magnitude but opposite in sign so that the sum $|V_3| + |V_4|$ is constant and independent of variations in $u$.

To examine the percentage error, the above equations can be rewritten:

$$\frac{\Delta|V_3|}{|V_3|} = \frac{E\sqrt{2}}{4} \cdot \frac{\sqrt{2}}{E} \cos 2\theta \cdot \frac{\Delta u}{u} = -\frac{\Delta|V_4|}{|V_4|}$$

$$= 1/2 \cdot \cos 2\theta \cdot \frac{\Delta u}{u}$$

The variation of $|V_3|$ and $|V_4|$ for a 5 percent increase in the source frequency is shown in FIG. 2A. If $|V_m|$ is obtained from adding $|V_3|$ and $|V_4|$, it will be virtually immune from effects arising out of small changes in excitation frequency.

TEMPERATURE COEFFICIENTS OF $R$ AND $C$

If we put $$N_1 = w\,R_1\,C_1$$

$$\text{and} \qquad N_2 = \frac{1}{wR_2C_2}$$

$$\text{Then,} \quad |V_3| = \frac{(V_s^2 + N_1^2V_c^2)^{1/2}}{(N_1^2+1)^{1/2}}$$

$$|V_4| = \frac{(V_s^2 + N_2^2V_c^2)^{1/2}}{(N_2^2+1)^{1/2}}$$

Adding and rearranging,

-continued $$|V_3|+|V_4| = \frac{\{(N_2^2+1)V_s^2+(N_2^2+1)N_1^2V_c^2\}^{1/2} + \{(N_1^2+1)V_s^2+(N_1^2+1)N_2^2V_c^2\}^{1/2}}{(N_1^2+1)^{1/2}\,(N_2^2+1)^{1/2}}$$

It can be seen that a temperature change in the phase shifting circuit 18 which causes $N_1$ to rise will cause $N_2$ to fall in a similar proportion so that the expression above for $|V_3| + |V_4|$ will tend to compensate for temperature effects because the terms in $N_1$ and $N_2$ are balanced and both $N_1$ and $N_2$ would be very close to unity and equal.

Thus the phase shifting circuit 18 and peak detectors 27, 29 behave like a balanced bridge toward the environment.

In considering the occurrence of a slight phase discrepancy between the two input signals, supposing there is a phase difference of $\psi$ between the two input signals.

So, $V_3$ becomes $aV_c - j\, b\, V_c$ where a = Cos $\psi$ b = Sin $\psi$

Recalcuation of $|V_3|$ and $|V_4|$ yields:

$$|V_3| = \frac{E}{\sqrt{2}}\, 2\,\mathrm{Sin}\psi\,\mathrm{Sin}\theta\,\mathrm{Cos}\theta$$

$$|V_4| = \frac{-E}{\sqrt{2}}\, 2\,\mathrm{Sin}\psi\,\mathrm{Sin}\theta\,\mathrm{Cos}\theta$$

differentiating with respect to $\psi$:

$$\Delta|V_3| = \frac{E\sqrt{2}}{4}\mathrm{Sin}2\theta\,\mathrm{Cos}\psi\cdot\Delta\psi$$

$$\Delta|V_4| + \frac{-E\sqrt{2}}{4}\mathrm{Sin}2\theta\,\mathrm{Cos}\psi\,\Delta\psi$$

Therefore, small phase differences will have no effect on $V_m$ because the sum of resultant small changes in $|V_3|$ and $|V_4|$ will be negligible.

An inverter constructed according to the invention provides heading components which are constant and repeatable for any given heading because the components are given in terms of voltage ratios and the unwanted fluctuations are cancelled. This occurs because the sine-cosine signals are compared with a reference voltage which is derived from the heading signals and fluctuates in accordance with signal irregularities.

What is claimed is:

1. A device for converting angular movement to electrical signals comprising a signal device connected to a source of voltage subject to irregularities and energized thereby and having an angularly displaceable element and providing two signals varying in amplitude as a function of the sine and cosine of the angular displacement, the signals being subject to the irregularities in the energizing source and fluctuating as a result thereof, means for deriving a reference voltage from the two signals including a bridge circuit for shifting the relative phases of the signals equally in opposite directions and for providing a fixed amplitude output except for the source irregularities, and means responsive to the amplitudes of the signals and reference voltage and providing outputs corresponding to the ratios of the signals and the reference voltage in which fluctuations due to irregularities of the energizing voltage are cancelled.

2. A device for converting angular movement to electrical signals as described in claim 1 in which the means for deriving a reference voltage includes detecting means for detecting amplitudes of the phase-shifted signals and means for combining the detected amplitude signals.

3. A device for converting angular movement to electrical signals comprising a signal device connected to a source of voltage subject to irregularities and energized thereby and having an angularly displaceable element and providing two signals varying in amplitude as a function of the sine and cosine of the angular displacement, the signals being subject to the irregularities in the energizing source and fluctuating as a result thereof, means for deriving a reference voltage from the two signals so that the amplitude of the reference voltage fluctuates in accordance with fluctuations of the signals due to the irregularities in the energizing source, and means responsive to the amplitudes of the signals and reference voltage including a ramp generator for converting the reference voltage to a ramp voltage and comparing means for comparing the sine and cosine signals with the ramp signal to provide outputs corresponding to the ratio of the sine signal and reference voltage and to the ratio of the cosine signal and reference voltage in which fluctuations due to irregularities of the energizing voltage are cancelled.

4. A device for converting angular movement to electrical signals as described in claim 3 which includes amplitude demodulator means for converting the sine and cosine signals to direct current signals for comparison with the ramp voltage from the ramp generator means.

5. A device for converting angular movement to electrical signals as described in claim 3 which includes half wave rectifier means for converting the sine and cosine signals to direct current signals for comparison with the ramp voltage from the ramp generator means.

6. A device for converting angular movement to electrical signals comprising a signal device connected to a source of voltage subject to irregularities and energized thereby and having an angularly displaceable element and providing two signals varying in amplitude as a function of the sine and cosine of the angular displacement, the signals being subject to the irregularities in the energizing source and fluctuating as a result thereof, means for deriving a reference voltage from the two signals so that the amplitude of the reference voltage fluctuates in accordance with fluctuations of the signals due to the irregularities in the energizing source, means responsive to the amplitudes of the signals and reference voltage and providing outputs corresponding to the ratios of the signals and the reference voltage in which fluctuations due to irregularities of the energizing voltage are cancelled, and means for converting the signal ratios to digital signals including a source of pulses, a pair of AND gates connected to the pulse source and controlled by the signal ratios and a counter connected to each of the AND gates for counting the pulses passed thereby.

7. A device for converting angular movement to electrical signals comprising a signal device connected to a source of alternating voltage subject to irregularities and energized thereby and having an angularly displaceable element and providing two alternating signals varying in amplitude as a function of the sine and cosine of the angular displacement, the signals being subject to the irregularities in the energizing source and fluctuating as a result thereof, means for deriving a reference voltage from the two alternating signals so that the reference voltage fluctuates in accordance with the fluctuations of the signals due to irregularities in the energizing source, said means including a bridge circuit for shifting the relative phases of the signals equally in opposite directions and a detector for detecting amplitudes of each of the phase-shifted signals and means for combining the detected signals, means for converting each of the sine and cosine alternating signals to direct current signals, and means responsive to the direct current signals and to the reference voltage and providing outputs corresponding to the ratios of the signals and the reference voltage in which fluctuations due to the irregularities of the energizing voltage are cancelled, said last mentioned means including a ramp generator for converting the reference voltage to a ramp voltage and comparing means for comparing the sine and cosine direct current signals with the ramp signal to provide outputs corresponding to the ratio of the sine and reference signals and to the ratio of the cosine and reference signals.

8. A device for converting angular movement to electrical signals as described in claim 7 including means for converting the signal ratios to digital signals.

9. A device for converting angular movement to electrical signals as described in claim 8 in which the means for converting the signal ratios to digital signals includes a source of pulses, a pair of AND gates connected to the pulse source and controlled by the signal ratios and a counter connected to each of the AND gates for counting the pulses passed thereby.

10. A device for converting angular movement to electrical signals as described in claim 7 including means for filtering the sine and cosine signals connected to the synchro.

* * * * *